United States Patent [19]
Matsunaga et al.

[11] Patent Number: 5,746,829
[45] Date of Patent: May 5, 1998

[54] IMPURITY CONCENTRATOR AND ANALYZER

[75] Inventors: Hideki Matsunaga; Hiroshi Yamaguchi, both of Kanagawa; Mitsuhiro Tomita; Seizou Doi, both of Tokyo; Masahiko Yoshiki, Kanagawa; Shoji Kozuka, Kanagawa; Masayuki Onuma, Kanagawa, all of Japan

[73] Assignee: Kabushiki Kaisha Toshiba, Kawasaki, Japan

[21] Appl. No.: 711,968

[22] Filed: Sep. 10, 1996

[30] Foreign Application Priority Data

Sep. 14, 1995 [JP] Japan ................ 7-237174
Mar. 14, 1996 [JP] Japan ................ 8-057905
Jul. 25, 1996 [JP] Japan ................ 8-196654

[51] Int. Cl.$^6$ ................................. C30B 35/00
[52] U.S. Cl. ................ 117/203; 117/89; 117/93; 117/200; 117/900
[58] Field of Search ................ 117/2, 89, 93, 117/103, 200, 202, 203, 204, 904, 917

[56] References Cited

U.S. PATENT DOCUMENTS 5,298,452 3/1994 Meyerson ................. 437/81
5,463,978 11/1995 Larkin et al. ............. 117/89
5,554,304 9/1996 Suzuki ...................... 216/2

OTHER PUBLICATIONS

Arrowsmith, "Laser Ablation of Solids for Elemental Analysis by Inductively Coupled Plasma Mass Spectrometry", Anal. Chem. 1987, 59, pp. 1437–1444.

*Primary Examiner*—Felisa Garrett
*Attorney, Agent, or Firm*—Foley & Lardner

[57] ABSTRACT

The invention provides a method for concentrating impurity contained in a semiconductor crystal sample 11 by irradiating repeatedly a specified position of the semiconductor crystal sample 11 with a laser beam having a specified intensity by means of a laser oscillator 13. Then the invention provides a method for analyzing impurity contained in the impurity concentrated area of the semiconductor crystal sample 11 in high sensitivity by means of a specified physical analyzing means. According to demand, a method of the invention concentrates impurity by means of a laser beam after forming an insulating film such as an oxide film and the like transparent to the laser beam on the surface of the semiconductor crystal sample. At the same time, the invention provides a concentrator and an analyzer to be used for these concentrating method and analyzing method.

10 Claims, 6 Drawing Sheets

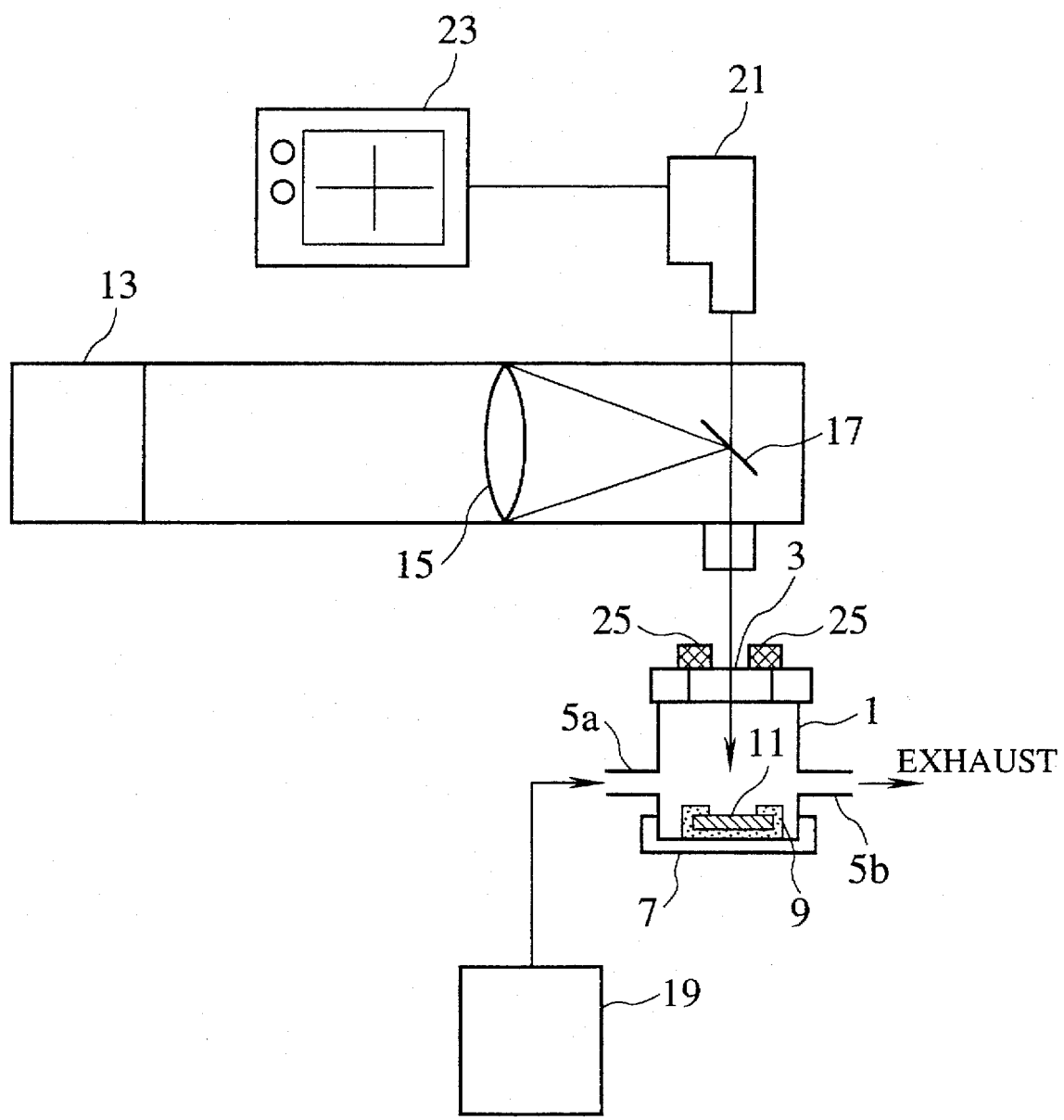

IMPURITY CONCENTRATOR AND ANALYZER

BACKGROUND OF THE INVENTION

1. Field of the Invention

The present invention relates to an impurity concentrating method for concentrating a small amount of impurity in a semiconductor crystal such as a silicon (Si) crystal and an impurity concentrator to be used in this concentrating method, and an impurity analyzing method for analyzing a concentrated impurity and an impurity analyzer to be used in this analyzing method.

2. Description of the Prior Art

In general, a silicon crystal is widely used as a material for a semiconductor device, and existence of a very small amount of impurity such as iron (Fe), copper (Cu), chromium (Cr), and the like has a great influence upon electric characteristics of a semiconductor device formed on a silicon crystal. In order to improve performance of a VLSI device and the like, therefore, it is necessary to keep these impurity concentrations contained in a silicon crystal as low as possible, and in order to do so, it is necessary to measure precisely the impurity concentration contained in the silicon crystal.

Up to now, a wet chemical analyzing method which solves a sample to be analyzed in an acid solution or acid vapor and separately concentrates impurity contained in it and then measures the impurity concentration by means of a flameless atomic absorption spectrometry, an inductive coupled plasma mass spectrometry or the like, and a physical analyzing method such as a secondary ion mass spectrometry (SIMS), a total reflection X-ray fluorescence spectrometry (TRXRF), an Auger electron spectrometry (AES), a particle induced X-ray emission spectrometry (PIXE), and the like are used in general as a method for measuring impurity contained in a semiconductor crystal and the like. However, since the wet chemical analyzing method needs a large quantity of sample to be analyzed and is very troublesome in solving the analysis sample and in concentrating separately impurities, this method needs a considerable skill for such a chemical operation technique and takes a very long analysis time. Furthermore, since this method uses an acid solution or acid vapor, it is necessary to install a special draft for acid use, a gas exhaust equipment, and an acid treatment equipment from a viewpoint of environment and safety.

On the other hand, since a physical analyzing method does not need a chemical operation as described above, or essentially different from the above-mentioned wet chemical analyzing method, the physical analyzing method can measure directly an impurity concentration in a solid analysis sample, it can be said that a physical analyzing method is more excellent in speediness than the wet chemical analysis method. And the physical analyzing method can make analysis with a smaller quantity of sample and is also more excellent in resolution in the depth direction than the wet chemical analyzing method. However, the above-mentioned physical analyzing methods other than the SISM method are about 10 ppm to 10000 ppm in analysis sensitivity, and are not suitable for detection of an extremely small quantity of impurities. And the SIMS method is also not capable of analyzing impurities of ppb or less order in density.

As described above, an existing wet chemical analyzing method has a problem that it needs a large quantity of analysis sample and a considerable skill for a chemical operation technique. And the existing wet chemical analyzing method has a problem that it is necessary to install a draft for acid use only, a gas exhaust equipment, and an acid treatment equipment.

On the other hand, an existing physical analyzing method has a problem that it is not enough in analysis sensitivity to detect an extremely small quantity of impurities.

SUMMARY OF THE INVENTION

The present invention has been performed in consideration of the above-mentioned circumstances, and an object of the invention is to provide an impurity concentrating method for concentrating impurity contained in a solid sample such as a semiconductor crystal sample without chemically solving the sample.

Another object of the invention is to provide an impurity concentrator to be used in this concentrating method.

Still another object of the invention is to provide an impurity analyzing method for analyzing quickly, simply and precisely impurity contained in a solid sample such as a semiconductor crystal and to provide an impurity analyzer to be used in this analyzing method.

In order to attain the above-mentioned objects, as a first feature the present invention provides an impurity concentrator and an impurity concentrating method using the concentrator which comprises a sealed container provided with an intake inlet and an exhaust outlet for a carrier gas; a window (an optical window) provided at the upper part of the sealed container; a sample fixing holder for securely fixing a semiconductor crystal sample so as not to move during irradiation of a laser beam which holder is provided opposite to the window inside the sealed container; a gas control means for controlling a quantity of the carrier gas to be supplied; an irradiating means such as a laser oscillator for irradiating repeatedly a specified position on the sample with a laser beam through the window; and an observing means for observing variation of the surface state of the sample through the window.

In the first feature, preferably, the irradiating means consists of plural laser oscillators different in wavelength from one another and irradiates said sample with laser beams different in wavelength. FIG. 3 shows an example of a concentrator using plural laser oscillators, and the concentrator may have three or more laser oscillators instead of two laser oscillators $13a$ and $13b$ s shown in FIG. 3.

Furthermore, in the first feature, preferably, the concentrator has a magnetic field generating means for applying a magnetic field to the sample. FIG. 6 shows an example of such apparatus. In FIG. 6, a magnetic field generating means 25 is provided at the upper part of the sealed container 1, but it may be provided at another place such as the lower part of the sealed container if it can make a magnetic force act so as to move a ferromagnetic material (impurity) contained in the sample to the surface of the sample.

Here, hydrogen ($H_2$), argon (Ar), helium (He), oxygen ($O_2$), nitrogen ($N_2$), and the like can be used as the carrier gas, but hydrogen is the most preferable, as described later.

An impurity concentrating method according to the first feature of the invention is a method for concentrating impurity in a semiconductor crystal, by means of the above-mentioned impurity concentrator. The method irradiates repeatedly a specified position of the surface of a semiconductor crystal sample with a laser beam being weaker in energy intensity than the intensity at which vaporization of a semiconductor crystal begins, as supplying at a specified flow rate a carrier gas into and exhausting it from the sealed container.

The concentrating method of the first feature of the invention can concentrate locally impurity contained in the sample without touching it, by irradiating repeatedly the surface of the semiconductor crystal sample and the like with a laser beam. The reason is that the surface of the sample is melted by irradiating it with a laser beam and then by cooling the crystal, a defect acting as a gettering site is generated in the vicinity of the surface of the crystal. And such impurity as Fe, Cu, Cr, or the like which are easy to diffuse in the crystal by the heat generated by the laser beam irradiation is precipitated in the vicinity of the defect. The sample is surely fixed by the sample fixing holder. It is for the purpose of preventing a sample from being moved by the thermal shock caused by the laser beam, during the laser beam irradiation. Because movement of the sample causes variation of the laser beam irradiating condition and makes uneven a degree of concentration, which is supposed to be essentially uniform in a specified range.

Particularly, it is desired that the concentrating method, which uses plural laser oscillators 13a and 13b, comprises a first and a second processes: the first process of irradiating repeatedly a specified position of the surface of a semiconductor crystal sample with first laser beam being weaker in energy intensity than the intensity at which vaporization of a semiconductor crystal begins, the first laser beam is emitted by the short-wavelength (first wavelength) laser oscillator 13a; and the second process of irradiating repeatedly a specified position of the surface of the semiconductor crystal sample with a second laser beam being weaker in energy intensity than the intensity at which vaporization of the semiconductor crystal begins, after the first process, by means of the laser oscillator 13b having a second wavelength longer than the first laser beam. Briefly, by the first process, irradiating repeatedly the surface of a sample with a first laser beam of shorter wavelength, and the next second process, irradiating it with a second laser beam of longer wavelength, it is possible to concentrate locally impurity contained in a deeper area in the crystal without physically touching it. The reason is that the surface of the crystal is melted by the first process of irradiating the surface of the sample with the first laser beam of shorter wavelength and then by cooling it, a defect acting as a gettering site is generated in the crystal, and next, by the second process of giving heat to the crystal with irradiation of the second laser beam of longer wavelength, such impurity as Fe, Cu, Cr, Ni, Mn, V, Ti, or the like contained in a deeper area in the crystal is diffused upward and precipitated in the vicinity of the defect.

And since the surface of the semiconductor crystal is cooled by introducing a carrier gas flow, vaporization of the sample can be suppressed. Accordingly, an energy intensity of a laser beam to be used can be increased relatively, and the concentration efficiency of a metal impurity in a crystal can be improved. Furthermore, since the sealed container, the crystal sample fixing holder, and the like are cooled by the carrier gas, an impurity contamination from them can be also suppressed.

Particularly, when irradiating the sample by a laser beam of long wavelength with supplying a carrier gas such as pure hydrogen, or a gas mixture of hydrogen and an inert gas such as argon or helium, such a metal impurity as Fe, Cu, Cr, or the like in a deeper area in the crystal becomes easy to diffuse by the thermal energy, and is moved and concentrated around the defect. Especially, the movement of impurity is promoted in the hydrogen environment. Therefore, by irradiating repeatedly the surface of a semiconductor crystal with a laser beam as described above, it is possible to concentrate densely a metal impurity in the crystal in the vicinity of the surface without touching it.

And in the first feature of the invention, by irradiating repeatedly the surface of a sample with a laser eam as applying a magnetic field to the surface of the sample by means of a magnetic field generating means 25 provided outside or inside the sealed container 1 as shown in FIG. 6, it is also possible to concentrate locally the impurity contained in the crystal without touching it. This improves more greatly the concentration efficiency by moving a ferromagnetic material (impurity) such as Fe, Ni, or the like in the crystal toward the surface of the crystal by a magnetic force applied to the semiconductor crystal sample by means of the magnetic field generating means 25.

The method for concentrating impurity in a semiconductor crystal of the first feature of the invention is a method for quickly, simply, and densely concentrating impurity without chemically solving the semiconductor crystal, but in this case , it is preferable to coat in advance the surface of the semiconductor crystal sample with an insulating film such as a silicon oxide film ($SiO_2$ film), a silicon oxynitride film (SiON film), a silicon nitride film ($Si_3N_4$ film), or the like which is transparent to a laser beam, prior to irradiation of the laser beam. By coating in advance the surface of the semiconductor crystal sample with an insulating film such as a silicon oxide film, a silicon oxynitride film, a silicon nitride film, or the like which has a high transmissivity to a laser beam and a low optical absorptivity, it is possible to efficiently heat selectively the semiconductor crystal sample with a laser beam. Therefore, it is possible to improve a concentration efficiency of a metal impurity in a semiconductor crystal and the like. At the same time, these insulating films formed on the surface of the semiconductor crystal can suppress vaporization loss of impurities in the semiconductor crystal as well as suppress a secondary contamination of the semiconductor crystal sample from the environment or the apparatus. A silicon oxide film, a silicon oxynitride film, or a silicon nitride ilm is made by means of a photo excited process with a UV laser beam in oxygen ($O_2$), ammonia ($NH_3$), nitric oxide (NO, $N_2O$) ambient or the like, and as they are, a concentrating process can be also performed in the same sealed container. The oxynitride film can be obtained by annealing oxide film in NO/inert gas mixture or $N_2O$/inert gas mixture with UV irradiation.

A second feature of the invention is an impurity analyzer and an impurity analyzing method using the impurity analyzer, which comprises; an impurity concentrator comprising a sealed container provided with an intake inlet and an exhaust outlet for a carrier gas, a window provided at the upper part of the sealed container, a sample fixing holder for securely fixing a semiconductor crystal sample which holder is provided opposite to the window inside the sealed container so as not to move during irradiation of a laser beam, a gas control means for controlling a quantity of the carrier gas to be supplied, a laser oscillator for irradiating repeatedly a specified position on the sample with a laser beam through the window, and an observing means for observing variation of the surface condition of the sample through the window; and an analyzing means for analyzing the impurity concentrated by the laser beam.

The second feature of the invention analyzes a sample in which impurity has been concentrated by the impurity concentrator by means of such a physical analyzing means as a secondary ion mass spectrometry (SIMS), a total reflection X-ray fluorescence spectrometry (TRXRF), an Auger electron spectrometry (AES), a particle induced X-ray emission spectrometry (PIXE), and the like. Here, it is preferable to irradiate and mark the outside around an impurity concentrated area of the sample surface with a laser beam having an energy value at which crystal vaporization begins, prior to starting analysis. And the laser beam for the marking is emitted by the laser oxcillator installed in the impurity concentrator. Because by irradiating and marking the outside around a specified position of the surface of a semiconductor crystal sample with the laser beam having a high energy intensity at which the semiconductor crystal vaporization can be started, it becomes easier to find the impurity concentrated area, namely, the analyzing area on the surface of the semiconductor crystal sample and it is possible to improve more greatly the analysis in sensitivity and accuracy.

In the second feature of the invention, since irradiation of a laser beam is performed inside the sealed container, it is possible to suppress contamination from the air ambient and detect a very small quantity of impurity with high sensitivity.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

BRIEF DESCRIPTION OF THE DRAWINGS

FIG. 6 is a figure showing a structural example of an impurity concentrator according to a third embodiment of the invention.

DETAILED DESCRIPTION OF THE EMBODIMENTS

Figure 1:
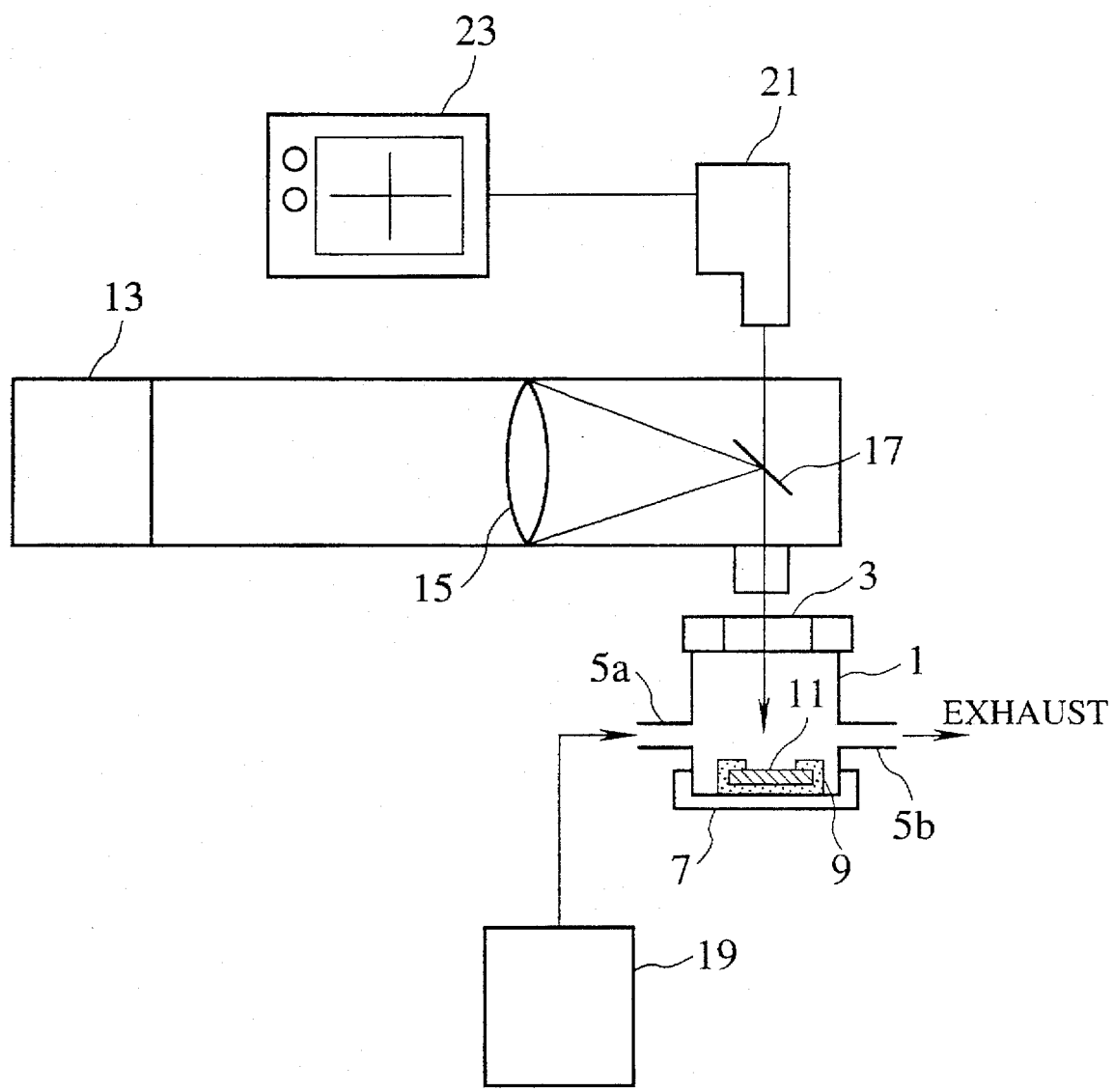
FIG. 1 is a figure showing a structural example of an impurity concentrator according to a first embodiment of the invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

(First embodiment)

FIG. 1 is a figure showing a structural example of an impurity concentrator according to a first embodiment of the invention. In FIG. 1, the impurity concentrator comprises a sealed container 1 of cylinder shape; a window (optical window) 3 provided at the upper part of the sealed container 1; an intake inlet 5a and an exhaust outlet 5b, which are provided in the side walls of the sealed container 1, for passing a carrier gas to cool the surface of a sample 11 of a semiconductor crystal and the like; a sample fixing holder 9 for securely fixing the sample 11 so as not to move during irradiation of a laser beam, and the fixing holder is provided on the bottom 7 opposite to the window 3 inside the sealed container 1; a laser oscillator 13 serving as an irradiating means for emitting a laser beam to be irradiated on the sample 11; a condenser lens 15 and a half mirror 17 which are provided on the optical path of the laser beam emitted from the laser oscillator (13) in order to irradiate the sample 11 with the laser beam; a gas control means 19 for controlling a quantity of the carrier gas to be supplied into the sealed container 1; and a TV camera 21 and a TV monitor 23 for observing variation of the surface state of the sample 11 through the window 3. Here, the sample needs to be kept fixed exactly at a correct position during irradiation of a laser beam at plural times. Because the sample 11 is apt to be moved by the thermal shock caused by the laser beam, and when the sample is moved, a laser irradiating condition onto a specified range varies and a degree of concentration in the specified range, required to be essentially uniform, varies.

Anything which transmits efficiently the laser beam, without disturbing directly or indirectly the analysis of an objective ingredient (impurity), can be used as a material for the optical window 3. Concretely, quartz, sapphire, Pyrex glass, and the like are desirable. And it is desired that the window 3 is set in the sealed container 1 by means of an O-ring or a metal gasket so as to be replaceable. As a material for the sealed container 1, anything which does not disturb directly or indirectly the analysis of the objective impurity can be used, and for example, fluorocarbon polymers such as PTFE, quartz, sapphire, Pyrex glass, metal, metallic alloy, and the like may be used.

As a material for the sample fixing holder 9, anything which does not disturb directly or indirectly analysis of the objective impurity can be used. Fluorocarbon polymers such as PTFE, metal, metallic alloy, and the like are desirable in a viewpoint of machinability. And it is desired that the sample fixing holder 9 is replaceable in relation to the sealed container 1 and the sample 11. Oxygen ($O_2$), nitrogen ($N_2$), argon (Ar), helium (He), hydrogen ($H_2$), and the like can be used as the carrier gas. As the laser oscillator 13, anything which can change optionally its laser energy value and has a laser energy enough to vaporize a semiconductor crystal sample can be used, and for example, an Nd-YAG laser, a ruby laser, an excimer laser, and the like may be used. Any type which can be used for observing variation of the surface state of a crystal sample under irradiation of a laser beam may be used as the TV camera 21 and the TV monitor 23.

Although not illustrated in FIG. 1, an impurity analyzer may be composed of an impurity concentrator and a physical analyzing means disposed adjacently to the impurity concentrator. The physical analyzing means may be such as a secondary ion mass spectrometer (SIMS), a total reflection X-ray fluorescence spectrometer (TRXRF), an Auger electron spectrometer (AES), a particle induced X-ray emission spectrometer (PIXE). The analyzing means analyzes the impurity in a sample 11 in which the impurity has been concentrated by the impurity concentrator.

Figure 2:
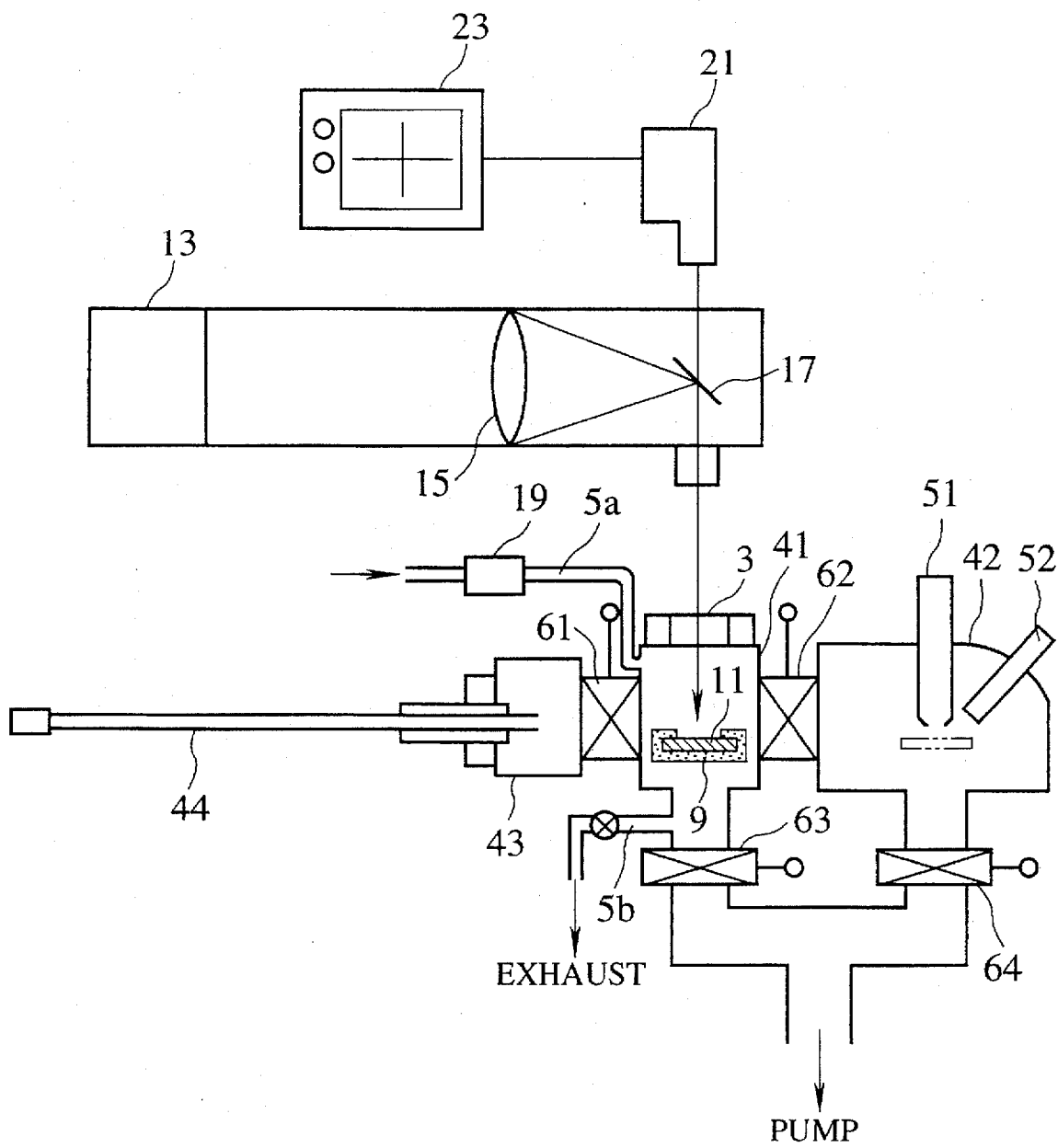
FIG. 2 is a figure showing a structural example of an impurity analyzer according to a first embodiment of the invention.

As shown in FIG. 2, an impurity analyzer may be composed by connecting a sealed container 41 for an impurity concentrator with an analyzing chamber 42 for an analyzing means such as an SIMS, a TRXRF, an AES, a PIXE, or the like through a gate valve 62. In the analyzing chamber 42 for the impurity analyzer of the first embodiment of the invention shown in FIG. 2, a radiation source 51 for an ion beam, an X-ray, an electron beam, or the like and an analyzing detector 52 are provided, and the sealed container 41 and the analyzing chamber 42 can be vacuum-evacuated by means of a turbo-molecular pump, a cryopump, an ion pump, or the like through the gate valves 63 and 64. In FIG. 2, a window 3 is provided at the upper part of the sealed container 41 of cylinder shape, and an intake inlet 5a and an exhaust outlet 5b for passing a carrier gas to cool the surface of a sample 11 such as a semiconductor crystal are provided on the side walls of the sealed container 41. And a sample fixing holder 9 for securely fixing the sample 11 so as not to move during laser beam irradiation is disposed on the position opposite to the window 3 inside the sealed container 41. Similarly to FIG. 1, an impurity analyzer of the first embodiment of the invention is provided with a laser oscillator 13 for emitting a laser beam to be irradiated on the sample 11; a condenser lens 15 and a half mirror 17 which are provided on the optical path of the laser beam emitted from the laser oscillator 13 in order to irradiate the sample 11 with the laser beam; a gas control means 19 for controlling a quantity of the carrier gas to be supplied into the inside of the sealed container 41; and a TV camera 21 and a TV monitor 23 for observing variation of the surface state of the sample 11 through the window 3.

And a sample preparing chamber 43 is provided before the sealed container 41 and connected to the container 41 through a gate valve 61, and an impurity-concentrated sample 11 can be transferred in vacuum from the sealed container 41 to the analyzing chamber 42 by means of a vacuum transfer system (transfer-rod) 44. The transfer-rod may be driven by electromagnetic force or other mechanical driving systems. According to the composition as shown in FIG. 2, it is possible to measure a very small quantity of impurity, without having the contamination of impurities in the air, or the adsorbate (impurity) on the surface of an impurity-concentrated sample. Although not illustrated, a sample vertically-moving mechanism for transferring the sample in vacuum is provided in the analyzing chamber 42, the sealed container 41 and preparing chamber 43. For example, the sample holder 9 in the sealed container 41 can receive the sample from the horizontally-moving transfer rod 44 and transfer the sample to the rod 44 as being vertically moved by the sample vertically-moving mechanism. Of course, in the same manner, a vertically-movable sample holder is provided also in the analyzing chamber 42 and the preparing chamber 43.

According to the impurity concentrator and the impurity analyzer of the first embodiment of the invention shown in FIGS. 1 and 2, it is possible to concentrate locally the impurity contained in a sample and analyze it without touching it, by irradiating repeatedly the surface of the sample such as a semiconductor crystal with a laser beam. The reason is that the surface of a sample is melted by the laser beam irradiation, and then by cooling it, a crystal defect acting as a gettering site is generated in the vicinity of the surface of the crystal, and furthermore such impurities as Fe, Cu, Cr, or the like which become easy to diffuse in the crystal by the thermal energy generated with the laser beam irradiation, are precipitated in the vicinity of the defect.

The greater the energy value of a laser beam is, the higher the concentration efficiency is, but since the analysis cannot be performed when the sample is vaporized, it is desired that the energy value of the laser beam is 80 to 97% of the maximum energy value at which the crystal begins vaporizing. And it is possible to cool the surface of the sample and suppress vaporization of the crystal sample by supplying a carrier gas inside the sealed container 41 through the intake inlet 5a and the exhaust outlet 5b. A flow rate of the carrier gas is controlled so as to be a specified flow rate by a gas flow rate control means (gas control means) 19 such as a mass flow controller, a needle valve, or the like. By cooling the sample surface, the energy value of the laser to be used is set relatively high, and the concentration efficiency of the impurity can be improved. Additionally, since the sealed container 41, the sample fixing holder 9, and the like also are simultaneously cooled by the carrier gas, contamination by impurities generated from them can be suppressed. Still further, according to the impurity concentrator of the first embodiment of the invention, since a laser beam is irradiated inside the sealed container 1, it is possible to suppress also contamination from the air ambient.

In the first embodiment of the invention, a simple and highly sensitive analysis can be performed by analyzing a sample 11 in which impurity has been concentrated by the impurity concentrator shown in FIG. 1. The impurity may be analyzed by means of a physical analyzing means such as an SIMS, a TRXRF, an AES, a PIXE, or the like, which analyzing means is disposed adjacently to the impurity concentrator. In this case, an impurity concentrated area can be made easy to retrieve and identify at the beginning of a later analysis by irradiating and marking the outside around the impurity concentrated area of the surface of a sample with a laser beam having an energy value at which vaporization of the sample begins. The laser beam for the marking is emitted by the laser oscillator installed in the impurity concentrator.

(Example 1.1) Analysis of a p-type substrate

A metal impurity contained in a boron-doped silicon substrate (resistivity: 6.9 Ω cm, thickness: 320 μm) was concentrated by means of the above-mentioned impurity concentrator and analyzed by means of a second ion mass spectrometer (SIMS). It was marked in advance the impurity concentrated area, by means of the laser installed in the impurity concentrator, in order to make it easy to identify an impurity concentrated area, when measuring the impurity concentrated area by means of the SIMS.

The impurity concentrating condition and the marking condition of the Si single crystal substrate, and the measuring condition of the SIMS are described in the following.

(1) Impurity concentrating condition
  Laser oscillator: YAG laser (wavelength: 1064 nm),
  Pulse energy: 170 mJ, and pulse width: 200 microseconds,
  Pulse repetition rate: 10 pulses/second,
  Pulse irradiation time: 600 seconds,
  Beam diameter: 100 μm,
  Spatial volume of the sealed container: approximately 80 cm$^3$,
  Carrier gas (Ar): 2 liters/minute.

(2) Marking condition
  Laser oscillator: YAG laser (wavelength: 1064 nm),
  Pulse energy: 210 mJ, and pulse width: 200 μs,
  Pulse repetition rate: 2 pulses/second,
  Pulse irradiation time: 1 second, Beam diameter: 100 μm, and marking area: 1 mm×1 mm.

(3) Measuring condition
  Measuring instrument: Cameca IMS4F, Primary ion beam: $O_2^+$,
  Acceleration voltage: 12 kV, Scanning area: 500 μm×500 μm,
  Current: 0.5 μA, Secondary ion acceleration voltage: 4.5 kV,
  Others: high mass resolution measurement.

A result of measuring ion intensity (cps) of Cu, Fe, and Cr from the top surface to the inside of 10 nm in depth of the Si substrate under the above-mentioned measuring condition is shown together with comparative examples in Table 1.

TABLE 1

| | Ion intensity (cps) | | |
|---|---|---|---|
| Items | Cu | Fe | Cr |
| Example 1.1 | 490 | 170 | 110 |
| Comparative example 1.1.1 Without performing an impurity concentration at all, the Si substrate was directly analyzed under the measuring condition (3) by means of the SIMS. | 5 | 21 | 18 |
| Comparative example 1.1.2 Only the pulse energy in the above-mentioned condition (1) was changed from 170 mJ to 200 mJ. | 60 | 80 | 47 |

(Example 1.2) analysis of an n-type substrate

Next, a metal impurity contained in a phosphorus-doped silicon single crystal substrate (resistivity: 1.9 Ω cm, thickness: 430 μm) was concentrated by means of the above-mentioned impurity concentrator and analyzed by means of the SIMS.

The impurity concentrating condition of the Si single crystal substrate, the measuring condition of the SIMS, and a result of the analysis are described in the following.

(1) Impurity concentrating condition
Laser oscillator: YAG laser (wavelength: 1064 nm),
Pulse energy: 180 mJ, and pulse width: 200 microseconds,
Pulse repetition rate: 10 pulses/second,
Pulse irradiation time: 600 seconds,
Beam diameter: 100 μm,
Spatial volume of the sealed container: approximately 80 cm$^3$,
Carrier gas (Ar): 2 liters/minute.

(2) Measuring condition
Measuring instrument: Cameca IMS4F, Primary ion beam: $O_2^+$,
Acceleration voltage: 12 kV, Scanning area: 500 μm×500 μm,
Current: 0.5 μA, Secondary ion acceleration voltage: 4.5 kV,
Others: high mass resolution measurement.

A result of measuring ion intensity (cps) of Cu, Fe, and Cr from the surface to the inside of 10 nm in depth of the Si substrate under the above-mentioned measuring condition is shown together with comparative examples in Table 2.

TABLE 2

| | Ion intensity (cps) | | |
|---|---|---|---|
| Items | Cu | Fe | Cr |
| Example 1.2 | 280 | 110 | 80 |
| Comparative example 1.2.1 Without performing an impurity concentration at all, the Si substrate was directly analyzed under the measuring condition (2) by means of the SIMS. | 7 | 16 | 7 |
| Comparative example 1.2.2 Only the pulse energy in the above-mentioned condition (1) was changed from 180 mJ to 200 mJ. | 37 | 24 | 21 |

(Second embodiment)

Figure 3:
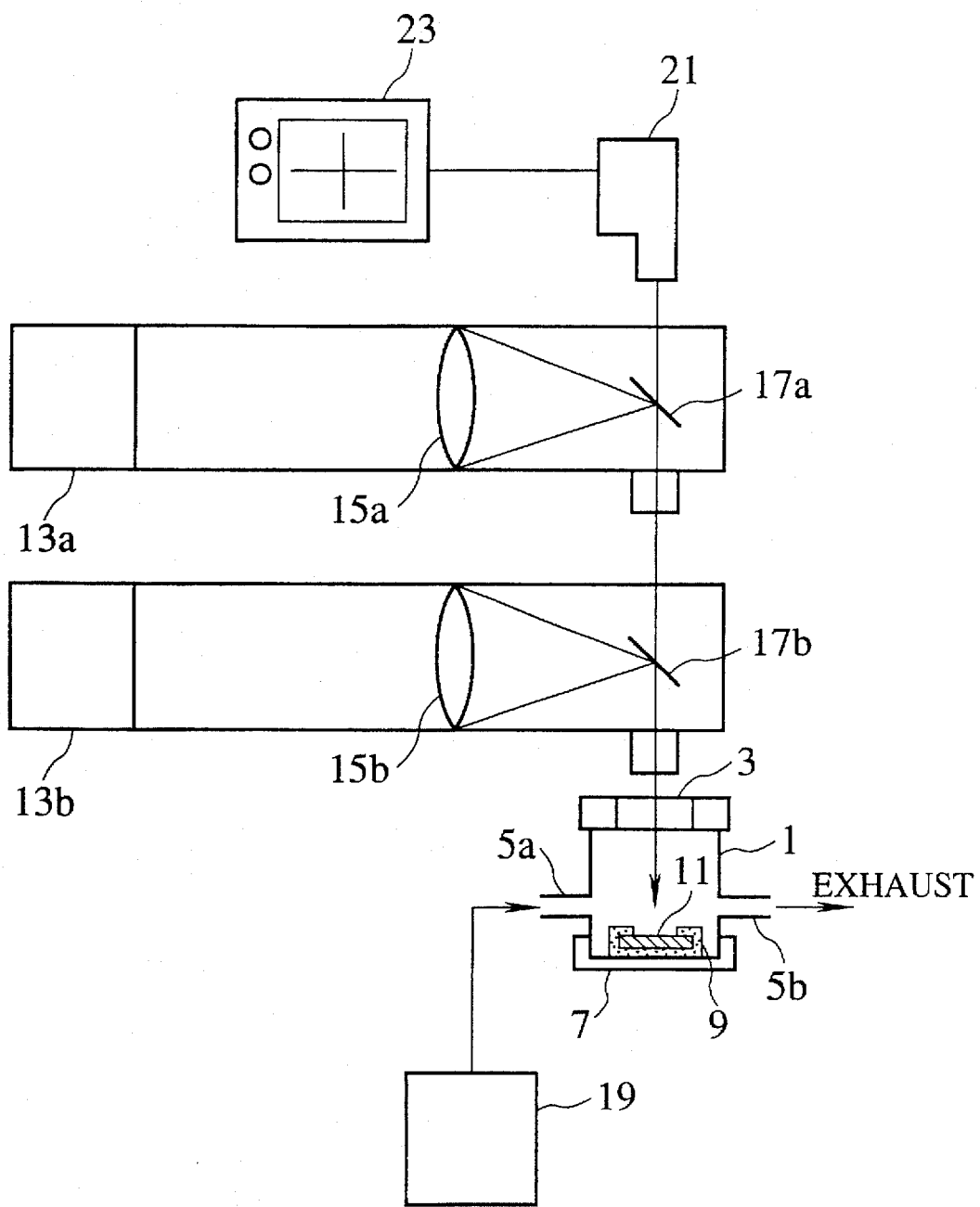
FIG. 3 is a figure showing a structural example of an impurity concentrator according to a second embodiment of the invention.

FIG. 3 is a figure showing a structural example of an impurity concentrator according to a second embodiment of the invention. In FIG. 3, the impurity concentrator comprises a sealed container 1 of cylinder shape; an optical window 3 provided at the upper part of the sealed container 1, an intake inlet 5a and an exhaust outlet 5b, which are provided in the side walls of the sealed container 1, for supplying a carrier gas to cool the surface of a sample; a sample fixing holder 9 for securely fixing the sample 11 so as not to move during irradiation of a laser beam which holder is provided on the bottom 7 opposite to the window 3 inside the sealed container 1; laser oscillators 13a and 13b serving as an irradiation means for emitting laser beams to be irradiated on the sample 11; condenser lenses 15a and 15b and half mirrors 17a and 17b which are provided on the optical path of the laser beams emitted from the laser oscillators 13a and 13b in order to irradiate the sample 11 with the laser beams; a gas control means 19 for controlling a quantity of the carrier gas to be supplied into the sealed container 1; and a TV camera 21 and a TV monitor 23 for observing variation of the surface condition of the sample 11 through the window 3. Here, the sample needs to be kept exactly at a correct position by the sample fixing holder 9 during irradiation of a laser beam at plural times. The reason why we use the sample fixing holder 9 is as follows: when the sample is moved, a laser irradiating condition in a specified range varies and an accurate analysis value cannot be obtained or an analysis error becomes great.

Anything which transmits efficiently the laser beam without disturbing directly or indirectly analysis of an objective ingredient can be used as a material of the window 3. Concretely, quartz, sapphire, Pyrex glass, and the like are preferable. And it is desired that the window 3 is set in the sealed container 1 by means of an O-ring or a metal gasket so as to be replaceable. As a material of the sealed container 1, anything which does not disturb directly or indirectly analysis of an objective impurity can be used, and for example, fluorocarbon polymers such as PTFE, quartz, sapphire, such heat resisting glass as Pyrex glass and the like, metal, alloy, and the like may be used. As a material of the sample fixing holder 9, anything which does not disturb directly or indirectly analysis of an objective impurity can be used. Fluorocarbon polymers, metal, alloy, and the like are desirable in a viewpoint of machinability. And it is desired that the sample fixing holder 9 is replaceable in relation to the sealed container 1 and the sample 11. As the carrier gas, $O_2$, $N_2$, Ar, He, $H_2$, and the like can be used.

As the laser oscillators 13a and 13b, anything which can change optionally its energy value (output) and has a laser energy enough to vaporize a semiconductor crystal sample can be used, and it will do to select a short-wavelength laser oscillator (a first laser oscillator) 13a and a long-wavelength laser oscillator 13b (a second laser oscillator), for example, out of an Nd-YAG laser, an SHGYAG laser, a ruby laser, a dye laser, an argon (Ar) laser, a carbon dioxide ($CO_2$) laser, an excimer laser, and the like. Concretely, a combination of an SHG-YAG laser of 532 nm in wavelength as a short-wavelength laser oscillator 13a and an Nd-YAG laser of 1064 nm in wavelength as a long-wavelength laser oscillator 13b may be used as an example. Any type which can be used for observing variation of the surface condition of a crystal sample caused by irradiation of a laser beam can be used as the TV camera 21 and the TV monitor 23.

Although not illustrated in FIG. 3, an impurity analyzer is composed of an impurity concentrator and a physical analyzing means such as an SIMS, a TRXRF, an AES, a PIXE, or the like for analyzing an impurity of a sample 11 in which the impurity has been concentrated by the impurity concentrator, and the analyzing means is disposed adjacently to the impurity concentrator. And in the same way as shown in FIG. 2, an impurity analyzer may be composed by connecting the sealed container 1 of an impurity concentrator and the analyzing chamber of a physical analyzing means through a gate valve.

In the second embodiment of the invention, the process for concentrating impurities comprising a first and a second processes: while supplying a carrier gas into and exhausting it from the sealed container 1 shown in FIG. 3, a specified position of the surface of a semiconductor crystal sample is irradiated with a first laser beam of short wavelength (first wavelength) having a slightly weaker energy intensity than the energy intensity at which vaporization of the semiconductor crystal begins, by means of the short-wavelength laser oscillator 13a (first process); the specified position of the surface of the semiconductor crystal sample is then irradiated with a second laser beam of long wavelength (second wavelength, which is longer than the first wavelength) having a slightly weaker energy intensity than the energy intensity at which vaporization of the semiconductor crystal begins, by means of the long-wavelength laser oscillator 13b (second process). Wavelength of the short-wavelength laser 13a is 100 to 1100 nm, and preferably, 150 to 600 nm. Wavelength of the long-wavelength laser oscillator 13b is 500 to 15000 nm, and preferably, 500 to 11000 nm. By the first irradiation on the surface of a semiconductor crystal with the first laser beam of short wavelength in the first process, by means of the impurity concentrator shown in FIG. 3, after the surface of the crystal is melted, and a crystal defect acting as a gettering site is generated in the vicinity of the surface of the crystal at the time of cooling. Next, when irradiating the surface of the crystal with the second laser beam of long wavelength while supplying the carrier gas flow in the second process, metal impurities such as Fe, Cu, Cr, Ni, Mn, V, Ti, existing in a deeper area in the crystal come to be easy to diffuse by the heat generated by the laser irradiation, and move toward the defect generated surface regions, and the impurities are concentrated. Therefore, by irradiating repeatedly the surface of the semiconductor crystal with the first and second laser beams as described above, it is possible to concentrate the metal impurity in the crystal locally and densely in the vicinity of the surface without touching it. For the purpose of improving the defectforming efficiency and the concentrating efficiency, it is preferable to perform the laser beam irradiation at many times in the first process and the second process, respectively. In case of performing the laser beam irradiation at a number of times, the first process and the second process can be performed alternately, but the last irradiation must be done in the second process. The greater the energy intensity of the laser beam is, the higher its effect is. But since the sample is vaporized when the energy intensity is too high, it is practically desired that the energy intensity of the laser beam is 80 to 97% of the energy intensity at which vaporization of the crystal sample can begin.

In the second embodiment of the invention, it is preferable that a silicon oxide film (SiO2 film), a silicon oxynitride film (SiON film), or a silicon nitride film ($Si_3N_4$ film) is formed in advance on the surface of the sample 11 of a semiconductor crystal and the like. A $SiO_2$ film, a SiON film, or a $Si_3N_4$ film can suppress loss caused by vaporization of impurities from a semiconductor crystal as well as can suppress a secondary contamination on the semiconductor crystal sample from the environment. In a viewpoint of suppression of the impurity loss and suppression of the secondary contamination, it is desired that the film thickness is as thick as possible. However, since it takes a long time to analyze the semiconductor crystal when it is too thick, it is preferable that the thickness is not greater than 300 nm, and particularly it is in a range of 10 nm to 200 nm. These films may be formed by means of any method such as a CVD method, a sputtering method, a spin-on-glass method, a thermal oxidation method, a thermal oxynitridation method, a thermal nitridation method, a photo excited oxidation method, a photo excited oxynitridation method, a photo excited nitridation method, or the like. For example, in case of a photo excited oxidation method, an SHG-YAG laser of 266 nm in wavelength can be suitably used. A silicon oxynitride (SiON) film may be formed by applying a thermal treatment of its oxide film in an $N_2O$ gas or an NO gas ambient. Only a semiconductor crystal sample can be efficiently heated by means of a laser beam by coating in advance the surface of the semiconductor crystal sample with an insulating film which is high in transmissivity of a laser beam and is low in optical absorptivity, such as a $SiO_2$ film, a SiON film, a $Si_3N_4$ film, or the like. Accordingly, it is possible to improve a concentration efficiency of a metal impurity in a semiconductor crystal.

Figure 4:
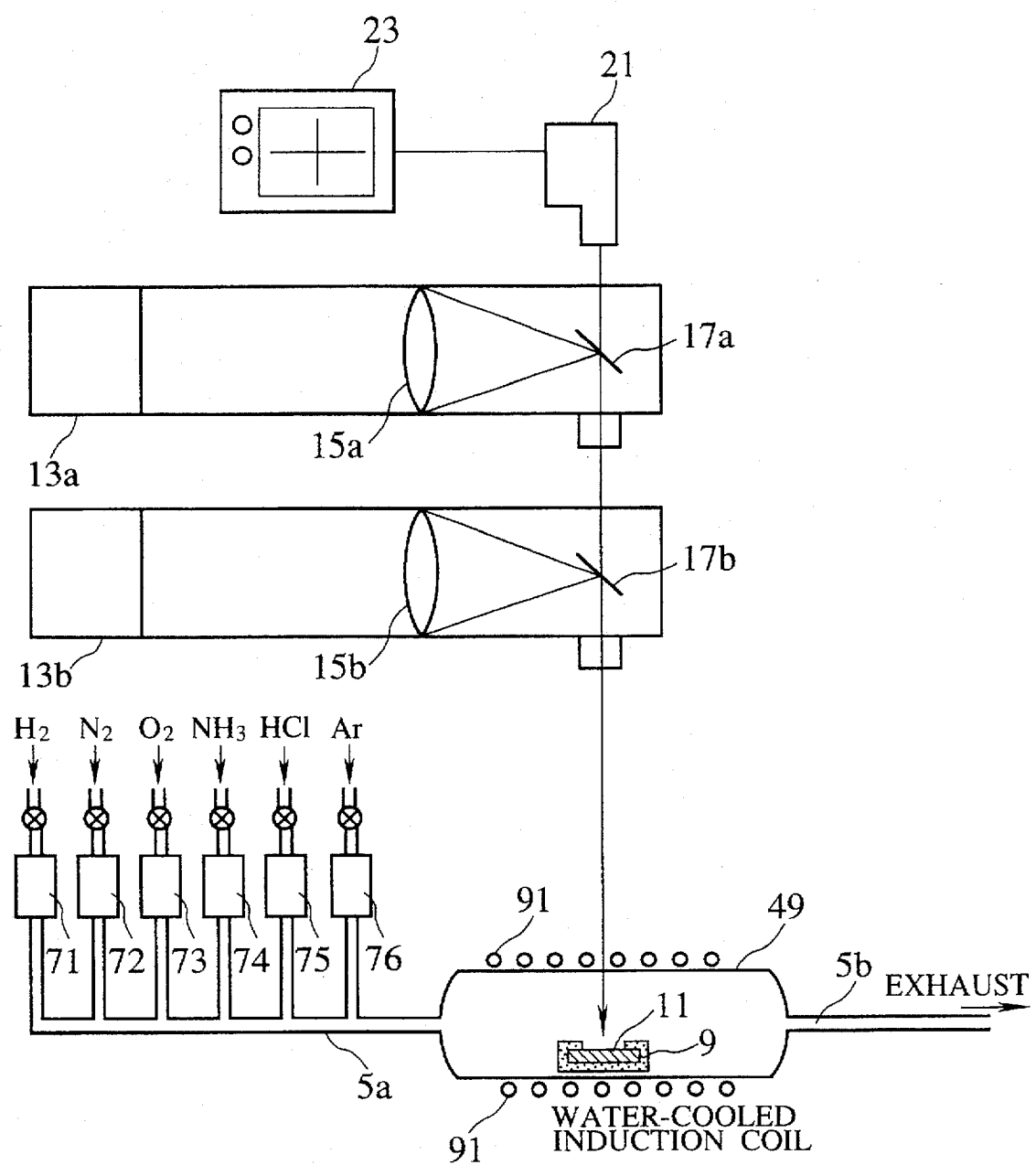
FIG. 4 is a figure showing a structural example of another impurity concentrator according to a second embodiment of the invention.
Figure 5:
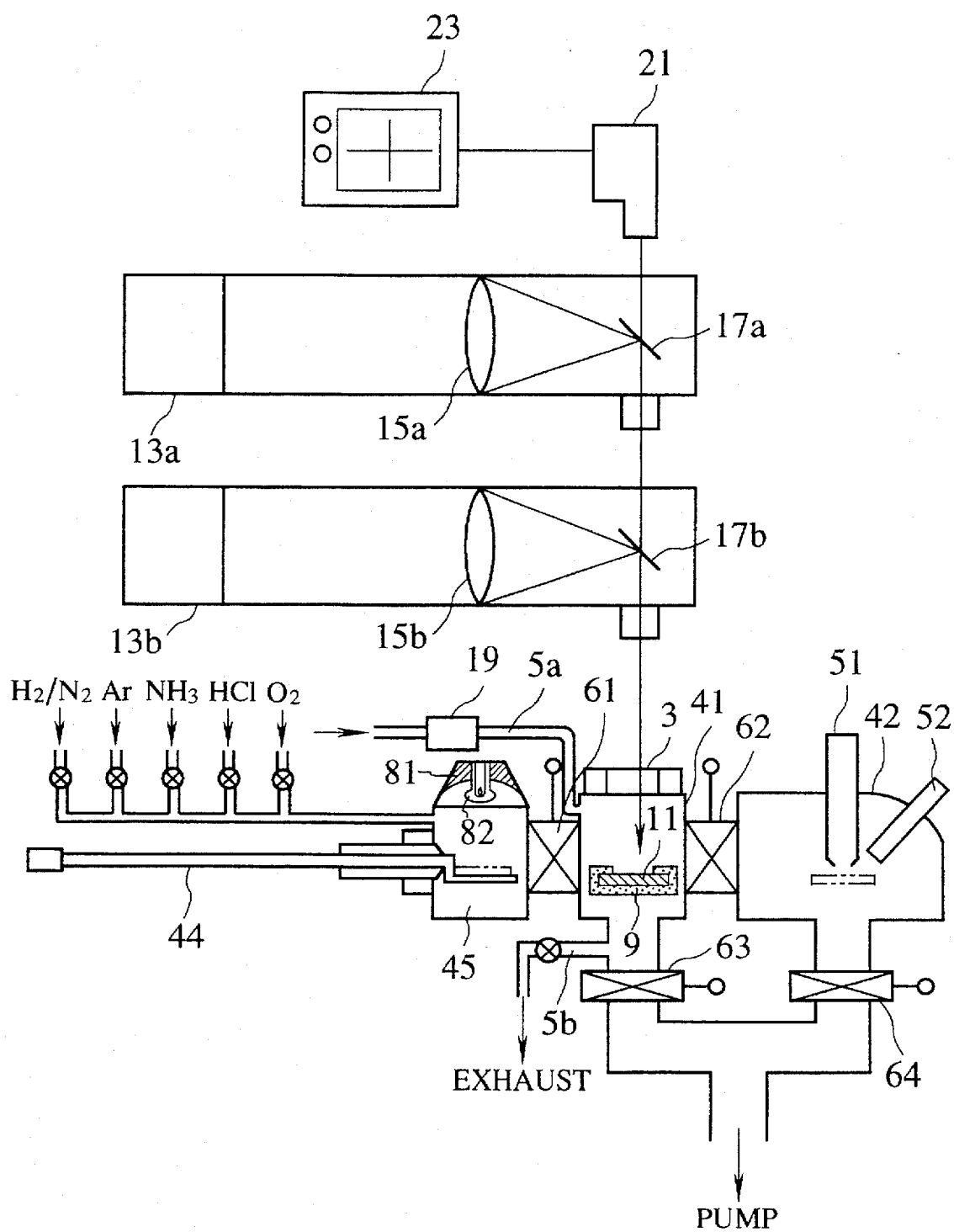
FIG. 5 is a figure showing a structural example of impurity analyzer according to a second embodiment of the invention.

In case of forming a $SiO_2$ film, a SiON film, or a $Si_3N_4$ film by means of a photo excited oxidation method, a photo excited oxynitridation method, or a photo excited nitridation method, these films can be also formed by irradiating a laser beam as supplying such gas as $O_2$, $N_2O$, NO, $NH_3$, and the like flow inside the sealed container 1. In order to form a transparent insulating film such as a $SiO_2$ film and the like and concentrate impurity in the same sealed container, it is preferable to use a reaction tube (sealed container) 49 made of a high purity quartz tube or a high purity quartz tube provided with a sapphire window as shown in FIG. 4. In FIG. 4, the reaction tube 49 is wound with a water-cooled induction coil 91 so that it may perform high-frequency (RF) induction heating. In case of performing the RF induction heating, it will do to use an SiC-coated carbon susceptor as a sample fixing holder 9. An infrared (IR) lamp heating method using a halogen lamp and the like also will do instead of the RF induction heating, and it is a matter of course that the substrate heating equipement such as the water-cooled induction coil 91 or the IR lamp is unnecessary in case of photo excited process. In FIG. 4, a flow rate of the reaction gas or the carrier gas is controlled by gas control means 71, 72, 73, 74, 75, and 76 such as a mass flow controller and the like. In order to form an oxide film, an oxynitride film, and a nitride film of high quality, since it is preferable to clean the surface of the semiconductor, it is preferable to introduce a mixed gas of HCl gas and $H_2$ gas onto the surface of the semiconductor substrate immediately before oxidation, oxynitridation or nitridation and perform a cleaning and etching off a native oxide film on the surface of the substrate. In order to form a nitride film, the substrate should be heated at 700° to 1300° C., or irradiate it with UV rays at a low temperature of 400° C. or lower, as letting an $NH_3$ gas or an Ar-diluted $NH_3$ gas flow. In case of using a reaction tube as shown in FIG. 4, it is generally unnecessary to employ the removable window for a laser beam, but it is more laborsaving in cleaning to employ the removable window. Because the frequency of the entire reaction tube is generally less than the frequency of cleaning the window. By using a reaction tube of quartz and the like as shown in FIG. 4, since a high-reactivity gas such as $NH_3$, HCl, and the like can be easily handled, it is easy to form a film and concentrate impurity inside the same container. Otherwise, as shown in FIG. 5, it will do to connect with each other a film forming chamber 45 and a sealed container 41 of the impurity concentrator through a gate valve 61. In FIG. 5, a semiconductor crystal sample 11 is heated by a halogen lamp (IR lamp) 82 in the film forming chamber 45 and a nitride film can be formed by supplying an NH$_3$ gas there. A light of the halogen lamp 82 is efficiently condensed on the surface of the semiconductor crystal sample 11 by a reflection mirror 81 such as a spheroidal mirror and the like. An IR lamp other than a halogen lamp may be used. And an oxide film can be formed by letting an oxygen gas flow and an oxynitride film can be formed in O$_2$, N$_2$O, NO or NH$_3$ ambient. An oxynitride film can be also formed by annealing an oxide film in an N$_2$O gas or an NO/inert gas at 850° C. to 1000° C. An oxynitride film of about 10 nm in thickness can be formed by a thermal treatment in N$_2$O at 850° C. for 30 minutes. It will do to open the gate valve 61 after forming the film and transfer the semiconductor crystal sample to the sealed container 41 and then perform an impurity concentration.

Furthermore, as shown in FIG. 5, an impurity analyzer may be composed by connecting with each other a sealed container 41 of an impurity concentrator and an analyzing chamber 42 of an analyzing means such as an SIMS, a TRXRF, an AES, a PIXE, or the like through a gate valve 62. In FIG. 5, a radiation source 51 of an ion beam, an X-ray, an electron beam, or the like and an analyzing detector 52 are provided in the analyzing chamber 42, and the sealed container 41 and the analyzing chamber 42 can be vacuum-evacuated by means of a turbo-molecular pump, a cryopump, an ion pump, or the like through the gate valves 63 and 64.

In FIG. 5, a semiconductor crystal sample 11 can be transferred in vacuum from the film forming chamber 45 to the sealed container 41 and from the sealed container 41 to the analyzing chamber 42 by means of the transfer rod 44.

An optical window 3 is provided at the upper part of the sealed container 41 of cylinder shape of the second embodiment of the invention shown in FIG. 5, and an intake inlet 5a and an exhaust outlet 5b for passing a carrier gas 10 to cool the surface of a sample are provided in the side walls of the sealed container 41, and a sample fixing holder 9 for securely fixing the sample 11 so as not to move during irradiation of a laser beam is disposed opposite to the window 3 inside the sealed container 41. Above the sealed container 41, laser oscillators 13a and 13b for emitting laser beams to be irradiated on the sample 11, condenser lenses 15a and 15b and half mirrors 17a and 17b which are provided on the optical paths of the laser beams emitted from the laser oscillators 13a and 13b in order to irradiate the sample 11 with the laser beam are disposed. And a TV camera 21 and a TV monitor 23 for observing variation of the surface state of the sample 11 through the window 3 are disposed so as to share the optical paths with the optical system.

According to the composition as shown in FIG. 5, it is possible to measure a very small quantity of impurity without having a small quantity of impurities in the air adsorbed on the surface of an impurity-concentrated sample. Although not illustrated, a sample vertically-moving mechanism for transferring the sample in vacuum is provided in the film forming chamber 45, the analyzing chamber 42, and the sealed container 41. For example, the sample holder 9 in the sealed container 41 can transfer the sample from the transfer rod 44 as being vertically moved by the sample vertically-moving mechanism. It is a matter of course that in the same manner a vertically-movable sample holder is provided also in the analyzing chamber 42.

According to the impurity concentrator or the impurity analyzer shown in FIGS. 3 to 5, since the surface of a semiconductor crystal is cooled by letting a carrier gas flow inside the sealed container 1 through the intake inlet 5a and the exhaust outlet 5b, it has an effect of suppressing vaporization of the crystal sample to do so. Accordingly, it is possible to increase relatively an energy intensity of a laser beam to be used and improve a concentration efficiency of a metal impurity inside the crystal. Furthermore, since the sealed containers 1, 41 and 49, and the crystal sample securely holding member 9 and the like are also cooled, impurity contamination from them can be also suppressed. Particularly, when irradiating a crystal sample with a laser beam of long wavelength as injecting a carrier gas of H$_2$ or H$_2$/inert gas mixture, metal impurities such as Fe, Cu, Cr, and the like existing in a deeper area inside the crystal also become easier to diffuse due to heat and H$_2$, and the impurities are moved toward the defect region, and the impurities are concentrated.

The reason is thought to be the following. H$_2$ is essentially easier to be adsorbed on an Si wafer than Ar, N$_2$, and the like, and moreover it has a greater diffusion coefficient inside the wafer. The diffusion coefficients of metal impurities inside the Si wafer are made greater by changing the carrier gas to H$_2$ in irradiation of a laser beam. And since H$_2$ is a reducing gas, as a result of the above-mentioned reaction the density of defects (most of which are caused by oxygen) inside the Si wafer is reduced and the diffusion velocity of such transition metal components as Cu, Fe, and the like is increased. Therefore, it is thought that transition-metal impurities inside the wafer are densely concentrated locally in the vicinity of the surface of the wafer where the density of defects is great by irradiating repeatedly the surface of a semiconductor crystal with a laser beam while supplying a H$_2$ or H$_2$/inert gas mixture on it.

According to the second embodiment of the invention, since a metal impurity in a crystal is densely concentrated locally in the vicinity of the surface of the crystal without touching it by irradiating it with a laser beam inside the sealed container 1, impurity contamination from the environment can be also suppressed. Furthermore, by irradiating and marking in advance the peripheral area around a specified position of the surface of a semiconductor crystal sample with a laser beam of energy intensity enough to begin vaporization of the semiconductor crystal, an impurity-concentrated area, namely, an analyzing area of the surface of the semiconductor crystal sample becomes easier to locate. Hence, it is possible to improve the analysis in sensitivity and accuracy. The laser beam to be used in marking is emitted from the laser oscillator installed in the impurity concentrator or the impurity analyzer shown in FIGS. 3 to 5. Wavelength of the laser beam to be used in marking is 100 nm to 15000 nm, and preferably 500 nm to 11000 nm. Although only two laser oscillators are shown in FIGS. 3 to 5, a third laser oscillator such as a CO$_2$ laser or the like may be added for use in marking. And by measuring a semiconductor crystal sample in which impurity is locally concentrated by the impurity concentrator shown in FIGS. 3 and 4, by means of an SIMS, a TRXRF, a PIXE, an AES, or the like, a simple and highly sensitive analysis can be performed. The marking process may be performed before or after irradiation of a laser beam in a concentration process (the first process or the second process). However, it is more efficient to perform the marking process before the concentration process.

(Example 2.1) Analysis of a p-type substrate

A metal impurity contained in a boron-doped silicon single crystal substrate (resistivity: 2.0 Ω cm, thickness: 330 μm) was concentrated by means of the above-mentioned impurity concentrator and analyzed by means of a second ion mass spectrometer (SIMS).

The impurity concentrating condition of the Si single crystal substrate, the measuring condition of the SIMS, and a result of the analysis are described in the following.

(1) Impurity concentrating condition

Laser oscillator (13a): SHG-YAG laser (wavelength: 532 nm),

Laser oscillator (13b): YAG laser (wavelength: 1064 nm),

Pulse energy: 170 mJ, and pulse width: 200 microseconds,

Pulse repetition rate: 10 pulses/second,

Pulse irradiation time: 300 seconds,

Beam diameter: 100 μm,

Spatial volume of the sealed container: approximately 80 cm$^3$,

Carrier gas (Ar): 2 liters/minute.

(2) Measuring condition

Measuring instrument: Cameca IMS4F, Primary ion beam: $O_2$,

Acceleration voltage: 12 kV, Scanning area: 500 μm×500 μm,

Current: 0.5 μA, Secondary ion acceleration voltage: 4.5 kV,

Others: high mass resolution measurement.

A result of measuring ion intensity (cps) of Cu, Fe, and Cr from the top surface to the inside of 10 nm in depth of the Si substrate under the above-mentioned measuring condition is shown together with comparative examples in Table 3.

TABLE 3

| | Ion intensity (cps) | | |
|---|---|---|---|
| Items | Cu | Fe | Cr |
| Example 2.1 | 930 | 380 | 190 |
| Comparative example 2.1.1 Without performing an impurity concentration at all, the Si substrate was directly analyzed under the measuring condition (2) by means of the SIMS. | 6 | 19 | 8 |
| Comparative example 2.1.2 The above-mentioned analysis was performed without using the YAG laser in the condition (1). | 72 | 46 | 23 |
| Comparative example 2.1.3 The above-mentioned analysis was performed without using the SHG-YAG laser in the condition (1). | 240 | 85 | 52 |

(Example 2.2) Analysis of an n-type substrate

A metal impurity contained in a phosphorus-doped silicon single crystal substrate (resistivity: 3.7 Ω cm, thickness: 420 μm) was concentrated by means of the above-mentioned impurity concentrator and analyzed by means of a SIMS.

The impurity concentrating condition of the Si single crystal substrate, the measuring condition of the SIMS, and a result of the analysis are described in the following.

(1) Impurity concentrating condition

Laser oscillator (13a): SHG-YAG laser (wavelength: 532 nm),

Laser oscillator (13b): YAG laser (wavelength: 1064 nm),

Pulse energy: 170 mJ, and pulse width: 200 microseconds,

Pulse repetition rate: 10 pulses/second,

Pulse irradiation time: 300 seconds,

Beam diameter: 100 μm,

Spatial volume of the sealed container: approximately 80 cm$^3$,

Carrier gas (Ar): 2 liters/minute.

(2) Measuring condition

Measuring instrument: Cameca IMS4F, Primary ion beam: $O_2$,

Acceleration voltage: 12 kV, Scanning area: 500 μm X 500 μm,

Current: 0.5 μA, Secondary ion acceleration voltage: 4.5 kV,

Others: high mass resolution measurement.

A result of measuring ion intensity (cps) of Cu, Fe, and Cr from the surface to the inside of 10 nm in depth of the Si substrate under the above-mentioned measuring condition is shown together with comparative examples in Table 4.

TABLE 4

| | Ion intensity (cps) | | |
|---|---|---|---|
| Items | Cu | Fe | Cr |
| Example 2.2 | 610 | 230 | 160 |
| Comparative example 2.2.1 Without performing an impurity concentration at all, the Si substrate was directly analyzed under the measuring condition (2) by means of the SIMS. | 6 | 14 | 8 |
| Comparative example 2.2.2 The above-mentioned analysis was performed without using the YAG laser in the condition (1). | 51 | 29 | 20 |
| Comparative example 2.2.3 The above-mentioned analysis was performed without using the SHG-YAG laser in the condition (1). | 150 | 62 | 43 |

(Example 2.3) Analysis of a p-type substrate

A boron-doped silicon single crystal wafer (square having a side of 10 mm) of 2.6 Ω cm in resistivity and 350 μm in thickness was prepared. The surface of the wafer is coated with an $SiO_3N_4$ film (20 nm) made by a CVD method, and irradiated first with a short-wavelength laser beam and next with a long-wavelength laser beam under the following condition by means of the impurity concentrator shown in FIG. 3. Then an ion intensity of the impurity was measured under the following condition by means of an SIMS.

(1) Impurity concentrating condition

First process: SHG-YAG laser (wavelength: 355 nm) and carrier gas Ar,

Second process: YAG laser (wavelength: 1064 nm) and carrier gas $H_2$,

Irradiation condition: Pulse: energy is 170 mJ,

Pulse width is 200 microseconds,

Pulse repetition rate is 10 pulses/second,

Pulse irradiation time is 300 seconds,

Beam diameter: 100 μm (common to the first and the second process),

Spatial volume of the sealed container: approximately 80 cm$^3$,

Carrier gas: 2 liters/minute.

Prior to irradiation of a laser beam in the first and the second process, each of four points in a square having a side of 2 mm on the surface of the Si wafer was marked by irradiating it with one pulse of laser beam of 200 mJ in pulse energy (1064 nm in wavelength).

(2) Measuring condition 'Analyzer: Model No. IMS4F manufactured by Cameca Inc.,

Primary ion beam: $O_2^+$,

Acceleration voltage: 12 kV, Scanning area: 500 µm×500 µm,

Current: 0.5 µA, Secondary ion acceleration voltage: 4.5 kV,

Others: high mass resolution measurement.

A result of measuring ion intensity (cps) of Cu, Fe, and Cr from the surface to the inside of 10 nm in depth of the Si wafer under the above-mentioned measuring condition is shown together with a comparative example and reference examples in Table 5.

TABLE 5

| Items | Ion intensity (cps) | | |
|---|---|---|---|
| | Cu | Fe | Cr |
| Example 2.3 | 3600 | 1400 | 730 |
| Comparative example 2.3.1 | 6 | 20 | 8 |
| An ion intensity measured in the same manner as example 2.3 excluding that the wafer was not coated with an SiON film and a concentrating operation was not performed. | | | |
| Reference example 2.3.1 | 6 | 19 | 7 |
| After coating the wafer with an SiON film, an ion intensity was measured under the same condition as example 2.3 excluding that a concentrating operation was not performed. | | | |
| Reference example 2.3.2 | 230 | 84 | 51 |
| After coating the wafer with an SiON film, the impurity was concentrated and measured under the same condition as example 2.3 excluding that the SHG-YAG laser was not used. | | | |
| Reference example 2.3.3 | 880 | 370 | 160 |
| The impurity was concentrated and measured under the same condition as example 2.3 excluding that the wafer was not coated with an SiON film. | | | |
| Reference example 2.3.4 | 1700 | 650 | 370 |
| After coating the wafer with an SiON film, the impurity was concentrated and measured under the same condition as example 2.3 excluding that Ar was used as a carrier gas instead of $H_2$ in the second process. | | | |

(Example 2.4) Analysis of an n-type substrate

A phosphorus-doped silicon single crystal wafer of 3.4 Ω cm in resistivity and 390 µm in thickness was set on the sample fixing holder 9 of the apparatus shown in FIG. 3. A $SiO_3N_4$ film of 11 nm in thickness was formed on the surface of the sample by irradiating the surface of the Si wafer with a laser beam to oxynitrize it as supplying a mixed gas of oxygen and ammonia.

A concentration process was applied to this Si wafer in the same manner as example 2.3, and an ion intensity of impurity in the obtained Si wafer was measured in the same manner as example 2.3. Ion intensity of Cu, Fe, and Cr from the surface to the inside of 10 nm in depth of the Si wafer is shown together with a comparative example and reference examples in Table 6.

TABLE 6

| Items | Ion intensity (cps) | | |
|---|---|---|---|
| | Cu | Fe | Cr |
| Example 2.4 | 2900 | 810 | 640 |
| Comparative example 2.4.1 | 5 | 13 | 8 |
| An ion intensity of impurity was measured under the same condition as example 2.4 without performing oxynitridation and concentration of the Si wafer. | | | |
| Reference example 2.4.1 | 5 | 13 | 7 |
| After coating the wafer with an SiON film, an ion intensity of the impurity was measured under the same condition as example 2.4 excluding that concentration was not performed. | | | |
| Reference example 2.4.2 | 130 | 55 | 41 |
| After coating the wafer with an SiON film, the impurity was concentrated and measured under the same condition as example 2.4 excluding that the SHG-YAG laser was not used. | | | |
| Reference example 2.4.3 | 590 | 230 | 150 |
| An ion intensity of the impurity was concentrated and measured under the same condition as example 2.4 excluding that oxynitridation of the Si wafer was not performed. | | | |
| Reference example 2.4.4 | 1300 | 400 | 330 |
| After coating the wafer with an SiON film, the impurity was concentrated and measured under the same condition as example 2.4 excluding that Ar was used as a carrier gas instead of H2 in the second process. | | | |

(Example 2.5) Analysis of a p-type substrate

A boron-doped silicon single crystal wafer (square having a side of 10 mm) of 2.3 Ω cm in resistivity and 330 µm in thickness was prepared. The surface of the wafer is coated with an $SiO_2$ film (20 nm) made by a CVD method, and irradiated first with a short-wavelength laser beam and next with a long-wavelength laser beam under the following condition by means of the impurity concentrator shown in FIG. 3. Then a metal ion intensity of the impurity was measured under the following condition by means of an SIMS.

(1) Impurity concentrating condition

First process: SHG-YAG laser (wavelength: 355 nm)
Second process: YAG laser (wavelength: 1064 nm),
Irradiation condition: Pulse energy is 170 mJ,
Pulse width is 200 microseconds,
Pulse repetition rate is 10 pulses/second,
Pulse irradiation time is 300 seconds,
Beam diameter: about 100 µm (common to the first and the second process),
Spatial volume of the sealed container: about 80 cm
Carrier gas: Ar,
Carrier gas supplying speed: 2 liters/minute.

Prior to irradiation of a laser beam in the first and the second process, each of four points in a square having a side of 2 mm on the surface of the Si wafer was marked by irradiating it with one pulse of laser beam of 200 mJ in pulse energy (1064 nm in wavelength).

(2) Measuring condition

Analyzer: Model No. IMS4F manufactured by Cameca Inc.,
Primary ion beam: $O_2^+$, Acceleration voltage: 12 kV, Scanning area: 500 μm 500 μm, Current: 0.5 μA, Secondary ion acceleration voltage: 4.5 kV, Others: high mass resolution measurement.

A result of measuring ion intensity (cps) of Cu, Fe, and Cr from the surface to the inside of 10 nm in depth of the Si wafer under the above-mentioned measuring condition is shown together with a comparative example and reference examples in Table 7.

TABLE 7

| | Ion intensity (cps) | | |
|---|---|---|---|
| Items | Cu | Fe | Cr |
| Example 2.5 | 1800 | 660 | 390 |
| Comparative example 2.5.1 A metal ion intensity in the Si wafer which is the same as example 2.5 excluding that it was not coated with an SiO2 film and was not processed with an impurity concentrating process, was measured in the same manner as example 2.5. | 6 | 19 | 8 |
| Reference example 2.5.1 A metal ion intensity in the Si wafer which is the same as example 2.5 excluding that it was not processed with an impurity concentrating process, was measured in the same manner as example 2.5. | 5 | 19 | 7 |
| Reference example 2.5.2 A metal ion intensity in the Si wafer which is the same as example 2.5 excluding that it was not processed with irradiation of a short-wavelength laser beam, was measured in the same manner as example 2.5. | 250 | 89 | 55 |
| Reference example 2.5.3 A metal ion intensity in the Si wafer which is the same as example 2.5 excluding that it was not coated with an SiO$_2$ film, was measured in the same manner as example 2.5. | 890 | 380 | 170 |

(Example 2.6) Analysis of an n-type substrate

A phosphorus-doped silicon single crystal wafer of 3.7 Ω cm in resistivity and 420 μm in thickness was set on the sample fixing holder 9 of the apparatus in FIG. 3, and an SiO$_2$ film of 10 nm in thickness was formed on the surface of the wafer by irradiating the surface of the Si wafer with a laser beam as supplying an oxygen gas to oxidize it.

A concentration process was applied to this Si wafer in the same manner as example 2.5, and a metal ion intensity of the impurity from the surface to the inside of 10 nm in depth of the obtained Si wafer was measured in the same manner as example 2.5. A result of the measurement is shown together with a comparative example and reference examples in Table 8.

TABLE 8

| | Ion intensity (cps) | | |
|---|---|---|---|
| Items | Cu | Fe | Cr |
| Example 2.6 | 1300 | 410 | 320 |
| Comparative example 2.6.1 A metal ion intensity in the Si wafer which is the same as example 2.6 excluding that it was not coated with an SiO2 film and was not processed with an impurity concentrating process, was measured in the same manner as example 2.6. | 6 | 14 | 8 |
| Reference example 2.6.1 A metal ion intensity in the Si wafer which is the same as example 2.6 excluding that it was not processed with an impurity concentrating process, was measured in the same manner as example 2.6. | 5 | 12 | 7 |
| Reference example 2.6.2 A metal ion intensity in the Si wafer which is the same as example 2.6 excluding that it was not processed with irradiation of a short-wavelength laser beam, was measured in the same manner as example 2.6. | 140 | 58 | 42 |
| Reference example 2.6.3 A metal ion intensity in the Si wafer which is the same as example 2.6 excluding that it was not coated with an SiO$_2$ film, was measured in the same manner as example 2.6. | 590 | 240 | 150 |

(Third embodiment)

FIG. 6 is a figure showing a structural example of an impurity concentrator according to a third embodiment of the invention. In FIG. 6, the impurity concentrator 35 comprises a sealed container 1 of cylinder shape; an optical window 3 provided at the upper part of the sealed container 1; an intake inlet 5a and an exhaust outlet 5b, which are provided in the side walls of the sealed container 1, for passing a carrier gas to cool the surface of a sample 11; a sample fixing holder 9 for securely fixing the sample 11 so as not to move during irradiation of a laser beam, which holder is provided on the bottom 7 opposite to the window 3 inside the sealed container 1; a laser oscillator 13 for emitting a laser beam to be irradiated to the sample 11; a condenser lens 15 and a half mirror 17 which are provided on the optical path of the laser beam emitted from the laser oscillator 13 in order to irradiate the sample 11 with the laser beam; a gas control means 19 for controlling a quantity of the carrier gas to be supplied into the sealed container 1; a TV camera 21 and a TV monitor 23 for observing variation of the surface condition of the sample 11 through the window 3; and a magnetic field generating means 25 for applying a magnetic force to the sample 11. The magnetic field generating means 25 is arranged so that it can make a magnetic force to move a ferromagnetic material toward the surface of the sample, and it is not limited to the construction shown in FIG. 6. For example, a magnetic field generating means composed so as to surround the bottom or the side wall of the sealed container also will do if it can make a magnetic field act in a specified direction.

Here, $H_2$, Ar, He, $O_2$, $N_2$, and the like can be used as a carrier gas, but according to need, a small amount of $H_2$ may be added to the inert gas such as Ar, He. Fluorocarbon polymers, quartz, sapphire, Pyrex glass, metal, alloy, and the like may be used as a material of the sealed container 1 since they do not disturb directly or indirectly analysis of an objective impurity, but it is desired that the material is a non-magnetic material in case of metal or metallic alloy. The optical window 3 is preferably made of a transparent material such as quartz, sapphire, Pyrex glass, and the like, since they do not directly or indirectly disturbing analysis of an objective impurity and can efficiently transmit a laser beam. And it is desired that the window 3 is set in the sealed container 1 by means of an O-ring or a metal gasket so as to be replaceable. As a material of the sample fixing holder 9, anything which does not disturb directly or indirectly analysis of an objective impurity can be used. Fluorocarbon polymers, metal, alloy, and the like are desirable in a viewpoint of machinability. And it is desired that the sample fixing holder 9 is replaceable in relation to the sealed container 1 and the sample 11.

An Nd-YAG laser, a ruby laser, and the like are preferable as the laser oscillator 13, in a viewpoint of that it is necessary for the laser oscillator 13 to change optionally its energy value and have a laser energy enough to vaporize a sample. Any type which can be used for observing variation of the surface state of a sample caused by irradiation of a laser beam can be used as the TV camera 21 and the TV monitor 23.

Any of a permanent magnet and an electromagnet can be used as the magnetic field generating means 25, which is provided in order to attract such a ferromagnetic material as Fe, Ni, and the like contained in a sample to the surface of the sample. In a viewpoint of preventing contamination, the magnetic field generating means 25 is preferably disposed outside the sealed container 1 as shown in FIG. 6. However, in case that it is coated with a material excellent in thermal resistance, antioxidization, and chemical resistance such as Teflon and the like, it may be disposed inside the sealed container 1. When it is disposed inside the container 1, it is possible to put the magnetic field generating means 25 nearer to the sample 11 and increase the magnetic field in intensity.

Although not illustrated in FIG. 6, an impurity analyzer is composed of an impurity concentrator and a physical analyzing means such as an SIMS, a TRXRF, an AES, a PIXE, or the like for analyzing an impurity of a sample 11 in which the impurity has been concentrated by the impurity concentrator, which analyzing means is disposed adjacently to the impurity concentrator.

According to the configuration shown in FIG. 6, it is possible to concentrate locally an impurity contained in a sample without touching it by irradiating repeatedly the surface of the sample of a semiconductor crystal or the like with a laser beam. The reason is that the surface of the sample is melted by being irradiated with a laser beam, and then at the time of cooling, a crystal defect acting as a gettering site is generated in the vicinity of the crystal surface. And the thermal energy generated by the laser beam irradiation promotes the diffusion of such impurity as Fe, Cu, Cr, or the like in the crystal, and the impurity is precipitated in the vicinity of the defect. Particularly, by irradiating repeatedly the surface of a sample with a laser beam while applying a magnetic field to the surface of the sample 11 by means of the magnetic field generating means, it is also possible to concentrate locally impurity contained in the crystal 11 without touching it. Thus, a ferromagnetic material such as Fe, Ni, and the like is moved to the top surface of the semiconductor crystal sample 11 due to a magnetic force. By applying a magnetic field directing towards the top surface of the semiconductor crystal sample 11 by means of the magnetic field generating means 25, the concentration efficiency is improved more greatly. The greater the energy value of a laser beam is, the higher the concentration efficiency is, but since the analysis cannot be performed when the sample is vaporized, it is desired that the energy value of the laser beam is 80 to 97% of the energy value at which the crystal begins vaporizing.

In the third embodiment of the invention, a simple and highly sensitive analysis can be performed by analyzing a sample 11, in which an impurity has been concentrated by the impurity concentrator shown in FIG. 6. The impurity is analyzed by means of a physical analyzing means such as an SIMS, a TRXRF, an AES, a PIXE, or the like. The analyzing means may be disposed adjacently to the impurity concentrator. In this case, an impurity concentrated area can be made easy to retrieve and identify at the time of a later analysis by irradiating and marking the outside around the impurity concentrated area of the surface of a sample with a laser beam having an energy value at which vaporization of the crystal can begins. The laser beam for marking is emitted from the laser oscillator installed in the impurity concentrator.

(Example 3.1) Analysis of a p-type substrate

A metal impurity contained in a boron-doped silicon single crystal substrate (resistivity: 2.0 Ω cm, thickness: 330 µm) was concentrated by means of the above-mentioned impurity concentrator and was analyzed by means of an SIMS. The impurity concentrating condition of the Si single crystal substrate and the measuring condition of the SIMS are described in the following.

(1) Impurity concentrating condition
   Laser oscillator: YAG laser (wavelength: 1064 nm),
   Pulse energy: 170 mJ, and pulse width: 200 microseconds,
   Pulse repetition rate: 10 pulses/second,
   Pulse irradiation time: 600 seconds,
   Beam diameter: 100 µm,
   Spatial volume of the sealed container: approximately 80 cm$^3$,
   Carrier gas (Ar): 2 liters/minute.
   Magnetic field generating means: Teflon-coated permanent magnet (8 kilogauss, a length of 20 mm×a width of 20 mm×a thickness of 3 mm, and with a hole of 3 mm in diameter in the middle of it)

(2) Measuring condition
   Measuring instrument: Cameca IMS4F, Primary ion beam: $O_2^+$,
   Acceleration voltage: 12 kV, Scanning area: 500 µm X 500 µm,
   Current: 0.5 µA, Secondary ion acceleration voltage: 4.5 kV,
   Others: high mass resolution measurement.

A result of measuring ion intensity (cps) of Fe, Cu, Cr, and Ni from the surface to the inside of 10 nm in depth of the Si substrate under the above-mentioned measuring condition is shown together with comparative examples in Table 9.

TABLE 9

| Items | Ion intensity (cps) | | | |
|---|---|---|---|---|
| | Fe | Cu | Cr | Ni |
| Example 3.1 | 520 | 490 | 120 | 35 |
| Comparative example 3.1.1 The said analysis was performed without using the magnetic field generating means in the above-mentioned condition (1). | 170 | 480 | 110 | 10 |

TABLE 9-continued

| Items | Ion intensity (cps) | | | |
|---|---|---|---|---|
| | Fe | Cu | Cr | Ni |
| Comparative example 3.1.2 Without performing an impurity concentration at all, the Si substrate was directly analyzed by means of the SIMS under the measuring condition (2). | 21 | 6 | 8 | 3 |

(Example 3.2) Analysis of an n-type substrate Next, a metal impurity contained in a phosphorus-doped silicon single crystal substrate (resistivity: 3.7 Ω cm, thickness: 420 μm) was concentrated by means of the above-mentioned impurity concentrator and was analyzed by means of the SIMS.

The impurity concentrating condition of the Si single crystal substrate and the measuring condition of the SIMS are described in the following.

(1) Impurity concentrating condition

Laser oscillator: YAG laser (wavelength: 1064 nm),
Pulse energy: 180 mJ, and pulse width: 200 microseconds,
Pulse repetition rate: 10 pulses/second,
Pulse irradiation time: 600 seconds,
Beam diameter: 100 μm,
Spatial volume of the sealed container: approximately 80 cm$^3$,
Carrier gas (Ar): 2 liters/minute.

Magnetic field generating means: Teflon-coated permanent magnet (8 kilogauss, a length of 20 mm×a width of 20 mm×a thickness of 3 mm, and with a hole of 3 mm in diameter in the middle of it)

(2) Measuring condition

Measuring instrument: Cameca IMS4F, Primary ion beam: O$_2$+,
Acceleration voltage: 12 kV, Scanning area: 500 μm X 500 μm,
Current: 0.5 μA, Secondary ion acceleration voltage: 4.5 kV,
Others: high mass resolution measurement.

A result of measuring ion intensity (cps) of Fe, Cu, Cr, and Ni from the surface to the inside of 10 nm in depth of the Si substrate under the above-mentioned measuring condition is shown together with comparative examples in Table 10.

TABLE 10

| Items | Ion intensity (cps) | | | |
|---|---|---|---|---|
| | Fe | Cu | Cr | Ni |
| Example 3.2 | 320 | 280 | 90 | 32 |
| Comparative example 3.2.1 The said analysis was performed without using the magnetic field generating means in the above-mentioned condition (1). | 110 | 270 | 80 | 9 |
| Comparative example 3.2.2 Without performing an impurity concentration at all, the Si substrate was directly analyzed by the SIMS under the measuring condition (2). | 17 | 7 | 8 | 3 |

Various modifications will become possible for those skilled in the art after receiving the teachings of the present disclosure without departing from the scope thereof.

What is claimed is:

1. An impurity concentrator for concentrating impurity in a single crystal, the concentrator comprising:
   (a) a sealed container provided with an intake inlet and an exhaust outlet for a carrier gas;
   (b) a window provided at the upper part of said sealed container;
   (c) a sample fixing holder for securely fixing a single crystal sample, the sample fixing holder is provided opposite to said window inside said sealed container;
   (d) a gas control for controlling a quantity of said carrier gas to be supplied;
   (e) an irradiator for irradiating repeatedly a specified position of said sample with a laser beam through said window, the laser beam having an energy intensity which is weaker than the value at which vaporization of said single crystal sample begins, so that said impurity is precipitated in a vicinity of a surface irradiated by the laser beam; and
   (f) observing apparatus for observing variation of the surface condition of said sample through said window.

2. The concentrator of claim 1, wherein said energy intensity is between 80% and 98% of a maximum energy intensity at which vaporization of the single crystal sample begins.

3. The concentrator of claim 1, further comprising a marker for irradiating a surface of the single crystal sample at a periphery of an impurity precipitated area, the marker using a laser beam having an energy intensity at which vaporization of the single crystal sample begins.

4. The concentrator of claim 3, wherein said another laser beam is emitted by a laser oscillator contained in said irradiator.

5. The concentrator of claim 1, wherein the carrier gas is supplied to the surface of the single crystal sample to suppress vaporization of the single crystal sample.

6. The concentrator of claim 1, wherein the sample fixing holder prevents movement of the single crystal sample upon application of a thermal shock to the single crystal sample from the laser beam.

7. The concentrator of claim 1, wherein the sample fixing holder has a groove embedding the single crystal sample.

8. The concentrator of claim 1, wherein the sample fixing holder has a flange which securely catches the single crystal sample.

9. An impurity concentrator for concentrating impurity in a single crystal, the concentrator comprising:
   (a) a sealed container provided with an intake inlet and an exhaust for a carrier gas;
   (b) a window provided at an upper part of said sealed container;
   (c) a sample fixing holder for securely fixing a single crystal sample, the sample fixing holder is provided opposite to said window inside said sealed container;
   (d) a gas controller for controlling a quantity of said carrier gas to be supplied;
   (e) an irradiator for irradiating repeatedly a specified position of said sample with a laser beam through said window, said irradiator consisting of plural laser oscillators different in wavelength from one another and irradiating said sample with laser beams different in wavelength and
   (f) observing apparatus for observing variation of the surface condition of said sample through said window.

10. An impurity concentrator for concentrating impurity in a single crystal, the concentrator comprising:

(a) a sealed container provided with an intake inlet and an exhaust for a carrier gas;

(b) a window p rovided at an upper part of said sealed container;

(c) a sample fixing holder for securely fixing a single crystal sample, the sample fixing holder is provided opposite to said window inside said sealed container;

(d) a gas controllers for controlling a quantity of said carrier gas to be supplied;

(e) an irradiator for irradiating repeatedly a specified position of said sample with a laser beam through said window;

(f) observing apparatus for observing variation of the surface condition of said sample through said window; and (g) a magnetic field generator for applying a magnetic field to said sample.

* * * * *